United States Patent

Kouda

[11] Patent Number: 5,818,105
[45] Date of Patent: Oct. 6, 1998

[54] SEMICONDUCTOR DEVICE WITH PLASTIC MATERIAL COVERING A SEMICONDUCTOR CHIP MOUNTED ON A SUBSTRATE OF THE DEVICE

[75] Inventor: Tsunenobu Kouda, Tokyo, Japan

[73] Assignee: NEC Corporation, Tokyo, Japan

[21] Appl. No.: 505,084

[22] Filed: Jul. 21, 1995

[30] Foreign Application Priority Data

Jul. 22, 1994 [JP] Japan ................................ 6-170620

[51] Int. Cl.⁶ ..................... H01L 23/31; H01L 23/12; H01L 23/14
[52] U.S. Cl. ..................... 257/696; 257/695; 257/701; 257/703; 257/705; 257/706; 257/796
[58] Field of Search ................... 257/692, 693, 257/695, 696, 700, 701, 703, 705, 706, 787, 796, 666

[56] References Cited

FOREIGN PATENT DOCUMENTS

| 0239961 | 9/1989 | Japan | 257/695 |
|---|---|---|---|
| 0105961 | 5/1991 | Japan | 257/787 |
| 0150061 | 5/1992 | Japan | 257/701 |
| 0215465 | 8/1992 | Japan | 257/787 |
| 0225554 | 8/1992 | Japan | 257/696 |
| 0277636 | 10/1992 | Japan | 257/676 |
| 0198701 | 8/1993 | Japan | 257/796 |
| 0243448 | 9/1993 | Japan | 257/696 |

OTHER PUBLICATIONS

Shinko Electric Industries Co., Ltd., "Hyper–Quad" (Metal Core PCB QFP), Aug. 1993, 2 pages.

*Primary Examiner*—Peter Toby Brown

[57] ABSTRACT

A plastic covered semiconductor device that enables to simplify the structure and fabrication to reduce the assembly cost of the device and to reduce the thickness or height of the device. This device contains a substrate having a first surface and a second surface opposite to the first surface, a semiconductor chip mounted on or over the first surface, lead fingers joined to the first surface, interconnecting conductors electrically interconnecting the semiconductor chip with the corresponding lead fingers, respectively, and a plastic covering material formed to cover the first surface. Each lead finger is made of an inner part bonded to the first surface of the substrate and an outer part protruding the covering material. The covering material confines the semiconductor chip, the interconnecting conductors and the inner parts of the lead fingers. The second surface of the substrate is exposed from the covering material. An edge of the covering material is substantially in accordance with an edge of the first surface. The substrate acts as a top or bottom of a package of the device.

22 Claims, 5 Drawing Sheets

SEMICONDUCTOR DEVICE WITH PLASTIC MATERIAL COVERING A SEMICONDUCTOR CHIP MOUNTED ON A SUBSTRATE OF THE DEVICE

BACKGROUND OF THE INVENTION

1. Field of the Invention

The present invention relates to a semiconductor device and more particularly, to a plastic-covered semiconductor device containing a conductive or insulating substrate and a plastic covering material, the substrate acting as a top or bottom of the package.

2. Description of the Prior Art

FIG. 1 shows a first conventional plastic-molded semiconductor device, which was provided by IBIDEN CO., LTD. and termed "PACKTOHL (registered trademark)".

As shown in FIG. 1, this conventional device has a rectangular substrate 21 composed of an insulating material 21a and a metallic core 29 formed in the material 21a. The core 29 acts as an island or die pad of a semiconductor chip 24. The core 29 laterally extends to protrude from the material 21a at each side of the substrate 21, forming lead fingers 23.

Through holes 28 are formed to penetrate vertically the insulating material 21a at intervals in the periphery of the substrate 21. The holes 28 penetrate the corresponding lead fingers 23, respectively.

A patterned interconnection layer 22, which is made of plated nickel and gold, is formed on the surface of the substrate 21. The interconnection layer 22 extends into the inside of the holes 28, and is electrically connected with the lead fingers 23.

To reduce thermal resistance and thickness or height of the package body, the insulating material 21a is selectively removed at its center by spot-facing to expose the surface of the core 29. The semiconductor chip 24 is mounted or bonded onto the exposed surface of the core 29 by a conductive adhesive material 25. A silver paste is typically used as the adhesive material 25.

The chip 24 is electrically connected with the patterned interconnection layer 22 by bonding wire pieces 26 made of a fine gold wire.

The substrate 21, semiconductor chip 24, bonding wire pieces 26, and inner parts of the lead fingers 23 are confined within a plastic molding material 27. The molding material 27 is formed by a transfer molding process.

With this conventional semiconductor device of FIG. 1 that is termed "PACKTOHL", another interconnection layer may be provided on a back surface of the substrate 21 and therefore, semiconductor chips and passive circuit components can be mounted on both sides of the substrate 21. This means that this device is suitable for realizing a Multi Chip Package (MCP) in which a plurality of semiconductor chips are mounted within a single package.

FIG. 1 shows a "transfer-molded package structure" in which the substrate 21, semiconductor chip 24, bonding wire pieces 26, and inner parts of the lead fingers 23 are confined within the transfer-molded molding material 27. However, the device may have a "dipping-molded package structure" in which only the semiconductor chip 24 and its vicinity are confined within the molding material 27, and the substrate 21 itself acts as a top or bottom of the package. In this case, the material 27 is formed by a dipping process of a molten or liquid synthetic resin, which is popularly employed for making Chip On Board (COB) packages. This structure does not require such dam-bars for preventing the material 27 from leaking between adjacent lead fingers 23 as necessary in the transfer molding process.

FIG. 2 shows a second conventional plastic-molded semiconductor device, which was provided by MATSUSHITA ELECTRIC WORKS LTD. and termed "PC-QFP (registered trademark)".

As shown in FIG. 2, the second conventional device has a rectangular substrate 31 made of modified or denatured polyimide containing a woven glass cloth as its base material. A semiconductor chip 34 is mounted onto the substrate 31 at its center by a conductive adhesive material 35 such as a silver paste.

A patterned interconnection layer 32 made of plated gold is formed on the substrate 31 to surround the chip 34. The chip 34 and the layer 32 are electrically interconnected with each other by bonding wire pieces 36. The pieces 36 are plated with gold and bonded onto the interconnection layer 32 by a thermo-compression bonding process.

The substrate 31, semiconductor chip 34, bonding wire pieces 36, and inner parts of the lead fingers 33 are confined within a plastic molding material 37.

With the second conventional semiconductor device of FIG. 2 that is termed "PC-QFP", although the substrate 31 has a high glass transfer temperature of 200° C., the substrate 31 has a low rigidity. Therefore, this device is popularly fabricated as the transfer-molded package structure, as shown in FIG. 2.

Generally, since lead fingers have a minimum processible size, the inner parts or inner leads of the fingers cannot be sometimes designed to extend to the vicinity of a semiconductor chip, resulting in a long distance, such as several tens millimeters or longer, between the inner leads and the chip. In this case, a wire bonding process has to be performed across such the long distance and therefore, the bonded wire pieces are transformed in shape to be contacted with each other due to the flow of a molten molding material during a transfer molding process, causing a problem of electrical short-circuit.

On the other hand, with the second conventional semiconductor device of FIG. 2, the wire-bonding distance is reduced by the interconnection layer 32 formed on the substrate 31 and as a result, the above problem can be solved.

FIG. 3 shows a third conventional plastic-molded semiconductor device, which was provided by SHINKO ELECTRIC INDUSTRIES CO., LTD. and termed "Hyper Quad (trademark)".

SHINKO ELECTRIC INDUSTRIES CO., LTD. has provided several types of the package structure termed "Hyper Quad", which has a metal plate, a metal-core insulating substrate, or a wiring plate acting as a heat spreader and lead fingers bonded thereto. The lead-fingers are bonded by welding or adhesion. The semiconductor chip, bonding wire pieces and inner parts of the lead fingers are confined within a plastic molding material by a transfer molding process, except for the type termed the "Metal Quad Flat Pack" that is composed of an aluminum base and an aluminum cap and provides a cavity package structure.

The conventional semiconductor device shown in FIG. 3 is termed the type B of MC QFP (Metal Core PCB QFP), which is equivalent to the TYPE 6 of the Hyper Quad series.

In FIG. 3, this device has a rectangular metal-core substrate 41, upper and lower surfaces of which are covered with insulator layers 48a and 48b, respectively. A semiconductor chip 44 is mounted on the upper insulator layer 48a at the center of the substrate 41 by a conductive adhesive material 45.

A patterned interconnection layer 42, which is plated with gold, is formed on the insulator layer 48a. Lead fingers 43 are bonded onto the interconnection layer 42. The lead fingers 43 and the chip 44 are electrically interconnected with each other by bonding wire pieces 46.

The substrate 41, semiconductor chip 44, bonding wire pieces 46, and inner parts of the lead fingers 43 are confined within a plastic molding material 47. The lower insulator layer 48b is exposed from the material 47.

The third conventional semiconductor device of FIG. 3 has an improved thermal resistance. For example, in the case of the 28 mm×28 mm square package, the thermal resistance can be reduced by 30 to 40% compared with that of popular QFP.

FIG. 4 shows a fourth conventional plastic-molded semiconductor device, which is termed a "TAB-QFP". In FIG. 4, the fourth conventional device has a rectangular die pad 59 and lead fingers 53 extending outwardly at each side of the pad 59. The die pad 59 and lead fingers 53 are made of a lead frame. A semiconductor chip 54 is mounted onto the die pad 59 at its center by a conductive adhesive material 55 such as A silver paste.

A patterned TAB (Tape Automated Bonding) tape piece 52 is bonded onto the die pad 59 to surround the chip 54 by an adhesive material 58. The chip 54 and the TAB tape piece 52 are electrically interconnected with each other by bonding wire pieces 56a. The TAB tape piece 52 and the lead fingers 53 are electrically interconnected with each other by bonding wire pieces 56b.

The die pad 59, semiconductor chip 54, TAB tape piece 52, bonding wire pieces 56a and 56b, and inner parts of the lead fingers 53 are confined within a plastic molding material 57.

With the fourth conventional semiconductor device of FIG. 4, the wire-bonding distance can be readily reduced by only bonding the TAB tape piece 52 onto the die pad 59, which means that the popular plastic-molded package scarcely needs to be changed in structure. However, a problem of two necessary wire-bonding steps for the bonding wire pieces 56a and 56b occurs.

Such the composite leadframe made of a popular leadframe and a TAB tape piece as above has been provided by SUMITOMO METAL MINING CO., LTD. or TOPPAN PRINTING CO., LTD..

FIG. 5 shows a fifth conventional plastic-molded semiconductor device, which is termed BOL (Board On Lead) PKG.

As shown in FIG. 5, a rectangular substrate 61 is bonded on the inner parts of lead fingers 63 by an insulating epoxy resin 68. A semiconductor chip 64 is mounted onto the substrate 61 at its center by an insulating, thermosetting adhesive material 65. A patterned interconnection layer 62 is formed on the substrate 61 to surround the chip 64. The chip 64 and the interconnection layer 62 are electrically interconnected with each other by bonding wire pieces 66a. The interconnection layer 62 and the lead fingers 63 are electrically interconnected with each other by bonding wire pieces 66b.

The substrate 61, semiconductor chip 64, bonding wire pieces 66a and 66b, and inner parts of the lead fingers 63 are confined within a plastic molding material 67.

With the fourth conventional semiconductor device of FIG. 5 that is termed "BOL PKG", to bond the substrate 61 onto the lead fingers 63 at low cost, an insulating epoxy resin is selectively applied to the back side of the substrate 61 by a screen printing process and then, a leadframe having the lead fingers 63 is placed thereon, producing such the composite leadframe.

If a glass-epoxy substrate made of an epoxy resin and a woven glass cloth contained therein is employed, the adhesion of the substrate 61 to the molding material 67 made of an epoxy resin is improved.

Also, since no island or die pad is provided, an obtainable crack-resistance performance of this package is very high.

FIG. 6 shows a sixth conventional plastic-molded semiconductor device, which is termed "COF (Chip On Film)".

As shown in FIG. 6, this device has a rectangular substrate 71 made of a polyimide film containing an adhesive material 78 on its lower side. The film or substrate 71 is bonded onto the inner parts of lead fingers 73 by the adhesive material 78. A semiconductor chip 74 is mounted onto the substrate 71 at its center by an insulating adhesive material 75. The chip 74 and the lead fingers 73 are electrically interconnected with each other by bonding wire pieces 76.

The substrate 71, semiconductor chip 74, bonding wire pieces 76, and inner parts of the lead fingers 73 are confined within a plastic molding material 77.

With the sixth conventional semiconductor device of FIG. 6 that is termed "COF", since the substrate 71 is made of the polyimide film, it can be changed in size readily. Therefore, this device can respond to the different sizes of the chip 74 by using a common leadframe, which reduces the fabrication cost.

Table 1 shows in summary the substrate-lead finger interconnection and the substrate material of the first to sixth conventional plastic-molded semiconductor devices described above.

TABLE 1

| NAME | SUBSTRATE-L/F INTERCONNECTION | SUBSTRATE MATERIAL |
|---|---|---|
| PACKTHOL | THROUGH HOLE | GLASS/EPOXY |
| PC-QFP | THERMO-COMPRESSION BONDING | GLASS/POLYIMIDE |
| Hyper Quad | WELDING OR ADHESION | METAL, GLASS/EPOXY |
| TAB-QFP | ADHESION | TAB TAPE |
| BOL PKG | ADHESION | GLASS/EPOXY |
| COF | ADHESION | POLYIMIDE |

The first to sixth conventional plastic-molded semiconductor devices have the following problems, which are caused by their structures and/or fabrication processes.

The first conventional plastic-molded semiconductor device of FIG. 1 that is termed "PACKTOHL" has the following problems (1) to (4):

(1) Since the metallic core 29 of the substrate 21 is used for the die pad and lead fingers, the utilization efficiency of the substrate 21 is low and the insulating material 21a needs to be removable at the part where the lead fingers are provided. This makes the fabrication cost high.

(2) Since the interconnection layer 22 is electrically interconnected with the lead fingers 23 through the through holes 28, the minimum pitch or distance for the adjacent lead fingers 23 is limited by the minimum pitch for the through holes 28. As a result, this device cannot be applied for the case of the lead finger pitch of 0.5 mm or less.

(3) Since the substrate 21 needs to have a multilayer, structure made of at least three layers, the package height of this device is difficult to be reduced even if it is of the "dipping-molded package structure".

(4) To improve the adhesion strength between the metallic core 29 and the insulating material 21a, the metallic-core substrate 21 requires a blackening process at its surface. Therefore, limited materials that are acceptable for the blackening process can be employed for the metallic core 29 and the lead fingers 23.

The second conventional plastic-molded semiconductor device of FIG. 2 that is termed "PC-QFP" has the following problems (1) to (6):

(1) The fabrication cost is high because the heat-resistant substrate 31, which is made of modified or denatured polyimide containing a woven glass cloth, is used. Such the substrate 31 is necessary due to the fact that the gold-plated bonding wire pieces 36 are bonded to the gold-plated interconnection layer 32 by the thermo-compression bonding process.

(2) The necessary thickness of the plated gold layer for the bonding wire pieces 36 and the lead fingers 33 is about 1 micrometer in order to enable the thermo-compression bonding process. This also makes the fabrication cost high.

(3) In case of large pin counts, it is difficult to employ the gang bonding process for the bonding process of the bonding wire pieces 36 and the lead fingers 33, and as a result, the single point bonding (SPB) process is forced to be employed. This also makes the fabrication cost high.

(4) Since the necessary thickness of the plated gold layer of the lead fingers 23 is about 1 micrometer, there is a possibility that the bonding or soldering strength decreases due to an eutectic alloy of tin and lead during a soldering process using a tin-lead system solder.

(5) In the case of the "transfer-molded package structure", since the substrate 31 contains the polyimide resin, the substrate does not provide a good adhesion to an epoxy-system molding resin that is popularly used in the transfer molding process. Therefore, the crack-resistance that is regarded as important in the surface-mounted package tends to decrease.

(6) Since the substrate 31 containing the polyimide resin has an insufficient rigidity for the "dipping-molded package structure", it is difficult to realize the conventional semiconductor device termed "PC-QFP" [is difficult to be realized] as the "dipping-molded package structure".

The third conventional plastic-molded semiconductor device of FIG. 3 that is termed "Hyper Quad" has a problem of substantially higher fabrication cost than in the case of the popular plastic-molded Quad Flat Package (QFP).

The fourth conventional plastic-molded semiconductor device of FIG. 4 that is termed "TAB-QFP" has the following problems (1) to (3):

(1) Since the patterned TAB tape piece 52 that is more expensive than the leadframe is employed, the fabrication cost is very high.

(2) To ensure a good wire-bonding characteristic, a two-layer TAB tape, which is made of a base film and a copper foil formed on the film and contains no adhesive material between the copper foil and the base film, is forced to be employed as the TAB tape piece 52. This increases the fabrication cost.

(3) To bond the TAB tape piece 52 onto the die pad 59, the adhesive material 58 should have a high glass transfer temperature sufficient for preventing the deterioration of the wire bonding characteristic.

(4) Since the bonding wire pieces 56a interconnect the semiconductor chip 54 and the TAB tape piece 58 and the bonding wire pieces 56b interconnect the TAB tape piece 58 and the lead fingers 53, the necessary repeated number of the wire-bonding processes is twice the pin counts of the package. Accordingly, as the pin counts increase, the cost for the wire bonding process becomes higher than in the case of the popular plastic-molded package, which increase the fabrication cost of the device of FIG. 4.

The fifth conventional plastic-molded semiconductor device of FIG. 5 that is termed "BOL PKG" has the following problems (1) and (2).

(1) Because the substrate 61 having the interconnection layer 62 is bonded onto the lead fingers 63 and the semiconductor chip 64 is mounted on the substrate 61, it is difficult to realize the thickness reduction of the package.

(2) Similarly to the fifth conventional device of FIG. 4, since the bonding wire pieces 66a interconnect the semiconductor chip 64 and the interconnection layer 62 and the bonding wire pieces 66b interconnect the interconnection layer 62 and the lead fingers 63, the necessary repeated number of the wire-bonding processes is twice the pin counts of the package. Accordingly, as the pin counts increase, the cost for the wire bonding process becomes higher than in the case of the popular plastic-molded package, which increase the fabrication cost of the device of FIG. 5.

The sixth conventional plastic-molded semiconductor device of FIG. 6 that is termed "COF" has the following problems (1) and (2).

(1) Since the substrate 71 is made of a polyimide film, the substrate 71 does not provide a good adhesion to an epoxy-system molding resin that is popularly used in the transfer molding process. Therefore, the crack-resistance that is regarded as important in the surface-mounted package tends to decrease.

(2) Because the substrate 71 is bonded onto the lead fingers 73 and the semiconductor chip 74 is mounted on the substrate 71, it is difficult to realize the thickness reduction of the package.

On the other hand, to make a plastic-molded package, the transfer molding process has been popularly employed, in which a solid thermosetting molding resin at a B stage is heated to be melt and then, the molten resin thus obtained is injected into a molding die.

As the molding resin, an epoxy-system thermosetting resin containing silica fine powders as a filler is popularly used. This molding resin is preformed to be cylindrical pieces termed "tablets" and then, is supplied to the pots of the molding die, which is kept at a temperature of one hundred and several tens degree. Subsequently, the molten resin flows through the runners of the die under application of heat of one hundred and several tens degree and pressure of several tens kg/cm2, and further flows into the cavity through the gates of the die. Even after the injection into the cavity of the molten resin, the pressure is kept to be applied to the molten resin. After the molten resin solidifies sufficiently within the cavity due to the polymerization reaction, the molded resin is released from the molding die. Finally, the unnecessary parts of the resin that exist in the pots and runners are removed; thus, the transfer molding process is finished.

The "cycle time" is defined as the period from the start of this process to the end thereof. A typical value of the cycle time for the transfer molding process employing a popular resin and a popular molding die is about several minutes.

The transfer molding process has several technical limitations and therefore, the process has begun to cause the following problems (1) to (8) in view of the recent tendency of the semiconductor device packages:

(1) When the package thickness or height is reduced, the available gate becomes narrow so that the flowing rate of the molten molding resin into the cavity decreases, increasing the cycle time. If the flow rate is increased to prevent such the cycle time increase, the effective force of the flowing resin becomes larger and/or the filling rate difference of the resin into the respective parts of the cavity becomes remarkable. As a result, the bonding wire pieces, the inner parts of the lead fingers and the die pad confined in the cavity change in shape and/or position remarkably.

(2) When the package thickness or height is reduced, the available cavity cross-section is reduced, causing several molding defects such as non-filling and pin holes.

(3) Dam bars or tie bars are essentially provided between the adjacent lead fingers to prevent the molten resin from leaking through the gaps between the fingers. Such the dam bars of tie bars are not necessary for the plastic-molded semiconductor device and therefore, they have to be removed after finishing the molding process. This means that an extra process step and extra cost are necessary. Especially, as the pitch of the lead fingers becomes narrower, the removing process of the dam bars or tie bars becomes technically difficult more and more, increasing the process cost.

(4) In view of the structure of the transfer molding die, the resin injected into the pots and runners is not available. Therefore, the ratio of the available molten resin existing in the cavity to the total injected resin into the molding die is low, which means a disadvantage in cost.

(5) Since the molten resin is injected into the cavity at a temperature of one hundred and several tens degree and a pressure of several tens kg/cm2, a heavy and large-scale molding equipment is necessary. A warp or bend of the package tends to occur due to the shrinkage stress of the molten resin when the temperature of the resin lowers to room temperature. Such the warp or bend becomes remarkable for a large-sized and/or thin package.

(6) To release the cured molding resin from the molding die, ejector pins are necessarily provided in the molding die. Accordingly, the molding die becomes complicated in structure which leads to increase in cost.

(7) Since different molding dies are essentially produced in response to the different sizes of the package, the development of new packages requires a considerably high cost and a considerably long delivery time.

(8) If the adhesion strength of the molding resin to the lead fingers and/or semiconductor chip is enhanced to improve the crack-resistance performance of the package, the releasability of the cured resin from the molding die deteriorates to reduce the handling efficiency. Also, such the enhancement of the adhesion strength is limited due to a wax contained in the molding resin as a mold release agent.

In consideration with the above problems (1) to (8) existing in the transfer molding process, the transfer molding process seems to be especially difficult to be employed for the plastic-molded packages satisfying the following conditions (A), (B) and (C).

(A) package thickness or height: 1 mm or less
(B) lead pitch: less than 0.5 mm, pin count: more than 100
(C) package size: 20 mm×20 mm or larger FIG. 7 shows a seventh conventional plastic-molded semiconductor device, in which the popular transfer molding process is employed.

In FIG. 7, the seventh conventional device has a rectangular die pad 89 and lead fingers 83 extending outwardly at each side of the pad 89. The die pad 89 and lead fingers 83 are made of a leadframe. A semiconductor chip 84 is mounted onto the die pad 89 at its center by a conductive adhesive material 85 such as a silver paste.

The chip 84 and the lead fingers 83 are electrically interconnected with each other by bonding wire pieces 86.

The die pad 89, semiconductor chip 84, bonding wire pieces 86, and inner parts of the lead fingers 83 are confined within a plastic molding material 87.

FIG. 8 shows an eighth conventional plastic-molded semiconductor device, which was provided by SHARP CORPORATION to realize a thin package satisfying the above condition (A).

As shown in FIG. 8, the eighth conventional device is the same in structure as the seventh semiconductor device of FIG. 7 except for a die pad 89a having a recess or depression on its surface. The semiconductor chip 84 is mounted on the die pad 89a in the depression by the adhesive material 85, so that the thickness or height from the bottom of the pad 89a to the top of the chip 84 is reduced by the depth of the depression.

The pad 89a is selectively etched at its mounting area for the semiconductor chip 84 by about a half the thickness of the pad 89a, (e.g., by about 0.1 mm) to be thinner. It is said that the package thickness of 0.8 mm can be realized.

FIG. 9 shows a ninth conventional plastic-molded semiconductor device, which was provided by FUJITSU LIMITED to realize a thin package satisfying the above condition (A).

As shown in FIG. 9, the ninth conventional device is the same in structure as the seventh semiconductor device of FIG. 7 except for a die pad 89b placed at a level lower than the inner parts of the lead fingers 83. The bottom of the die pad 89b is about at the same level as the bottom of the plastic molding material 87 to exposed from the material 87. It is said that the package thickness of 0.6 mm can be realized.

Additionally, to make the package thinner, further conventional plastic-molded semiconductor devices were developed by MITSUBISHI ELECTRIC CORPORATION, FUJITSU LIMITED and TEXAS INSTRUMENTS JAPAN LIMITED. In one case, the outer parts of a tape carrier package (TCP) are directly bonded onto the inner parts of lead fingers, and then the TCP is confined within a plastic molding material by a conventional transfer molding process. In another case, the TCP itself is molded by a conventional transfer molding process.

However, it is said that an obtainable package thickness by these conventional devices is about 0.6 mm.

In the conventional plastic-molded semiconductor devices using a TCP, the conventional TAB technique is employed for bonding the lead fingers. Therefore, the bonding height from the top of the semiconductor chip to the top of the TAB tape is equal to the sum of the bump height and the inner part thickness of the TAB tape, the value of which is typically about several tens microns.

Compared with the loop height of the bonding wire piece, the value of which is typically 0.2 mm, the typical value of several tens microns is very large. The value of several tens microns is about in the same level as that of the popular plastic-molded package shown in FIG. 7. Thus, the conventional device using the TCP realizes only the bonding height of the same level as the conventional one in spite of using the TCP that scarcely requires the bonding height, the reason of which is as follows:

In the transfer molding process, to ensure the fluidity of the molten resin supplied to the cavity of the molding die, the flowing paths in the cavity each should have a cross-sectional height of at least about 0.2 mm.

SUMMARY OF THE INVENTION

Accordingly, an object of the present invention is to provide a plastic-covered semiconductor device that enables to simplify the structure and fabrication thereof, reducing the assembly cost of the device.

Another object of the present invention is to provide a plastic-covered semiconductor device that enables to readily reduce the thickness or height of the package.

Still another object of the present invention is to provide a plastic-covered semiconductor device that can be formed without using a transfer molding process.

A plastic-covered semiconductor device according to the present invention comprises a substrate having a first surface and a second surface opposite to said first surface; a semiconductor chip mounted on the first surface; lead fingers joined to the first surface; interconnecting conductors electrically interconnecting the semiconductor chip with the corresponding lead fingers, respectively; and a plastic covering material formed to cover the first surface.

Each of the lead fingers is made of an inner part bonded to the first surface of the substrate and an outer part protruding the covering material. The covering material confines the semiconductor chip, the interconnecting conductors and the inner parts of the lead fingers. An edge of the covering material is substantially in accordance with an edge of the first surface. The substrate acts as a top or bottom of a package of the semiconductor device.

With the semiconductor device according to the invention, the semiconductor chip is mounted on the first surface of the substrate and the second surface of the substrate is exposed from the covering material. An edge of the covering material is substantially in accordance with an edge of the first surface, and the substrate acts as a top or bottom of a package of the semiconductor device.

Therefore, a screen printing process can be employed for the step of forming the covering material instead of the conventional transfer molding process. This means that the structure and fabrication of the semiconductor device can be simplified to reduce the assembly cost of the device.

Also, since the plastic covering material is formed only the first surface of the substrate, the thickness or height of the package can be readily reduced.

Further, no transfer molding process is necessary for forming the plastic covering material.

The substrate is preferably made of a synthetic resin, a single-crystal silicon or a ceramic. In case of a synthetic resin, the fabrication cost is relatively low to the cases of the single-crystal silicon and ceramic.

Since single-crystal silicon has a superior thermal conductivity, a very low thermal resistance can be obtained. However, the cost of such silicon is very high.

When both of a low thermal resistance and a low cost are required for the substrate, a ceramic substrate is employed.

In a preferred case, the inner parts of the lead fingers are bonded onto the first surface of the substrate by using an insulating adhesive material, and the insulating adhesive material is applied on the first surface of the substrate by a screen printing process. An advantage of a thin thickness or height can be obtained.

In this case, the semiconductor chip is preferably bonded onto the first surface of the substrate by using a second insulating adhesive material, and the second insulating adhesive material is applied on the first surface of the substrate by a dispensing process. An advantage of avoidance of electrical short-circuit between the inner parts of the lead fingers can be obtained.

The plastic covering material is preferably formed by a screen printing process. The screen printing process enables to reduce the thickness or height of the plastic covering material.

The outer parts of the lead fingers are preferably bent to an opposite side to the second surface of the substrate. This structure of the lead fingers facilitates the handling of the package or device in vacuum absorption of the package and heat-radiator attachment to the package.

In another preferred case, a patterned conductor layer is additionally formed on the first surface of the substrate. The interconnection conductors and the corresponding inner parts of the lead fingers are connected with each other through the conductor layer, respectively. The patterned conductor layer reduces the bonding distances between the lead fingers and the semiconductor chip, which enables to employ a thinner bonding wire than the case of no such the conductor layer.

The patterned conductor layer is preferably formed by a screen printing process. The screen printing process enables to reduce the thickness or height of the plastic covering material. The screen printing process is preferably performed by using a conductive copper paste. The conductive copper paste preferably contains a thermosetting phenol resin and a copper powder dispersed within the resin.

DETAILED DESCRIPTION OF THE INVENTION

Preferred embodiments of the present invention will be described below while referring to FIGS. 10 to 12.

FIRST EMBODIMENT

Figure 1:
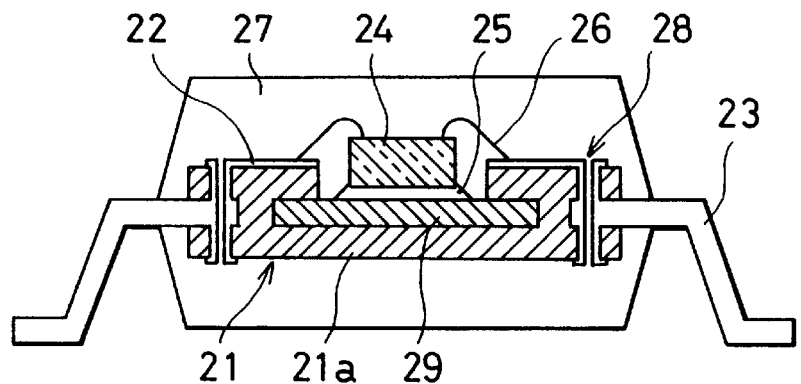
FIG. 1 is a cross-sectional view of a first conventional plastic-molded semiconductor device.
Figure 2:
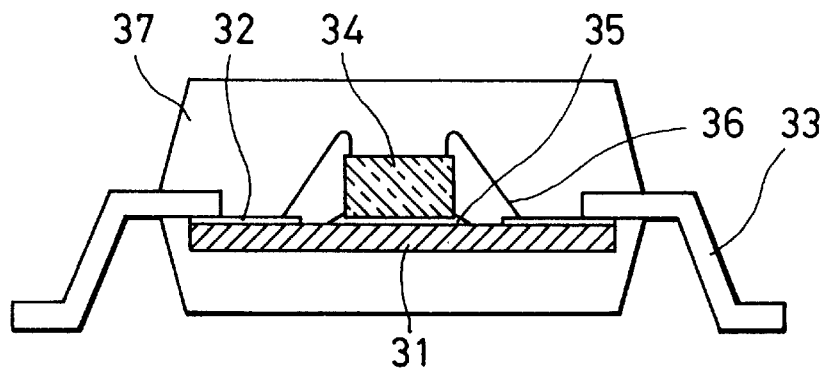
FIG. 2 is a cross-sectional view of a second conventional plastic-molded semiconductor device.
Figure 3:
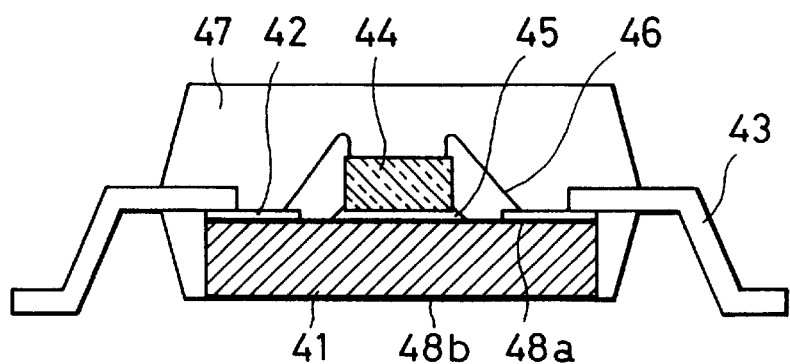
FIG. 3 is a cross-sectional view of a third conventional plastic-molded semiconductor device.
Figure 4:
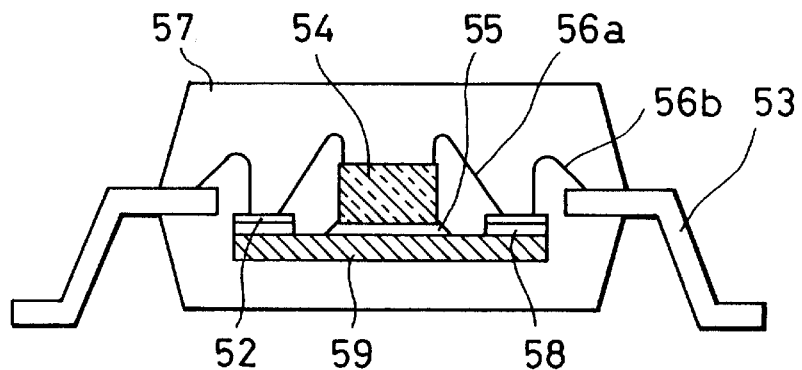
FIG. 4 is a cross-sectional view of a fourth conventional plastic-molded semiconductor device.
Figure 5:
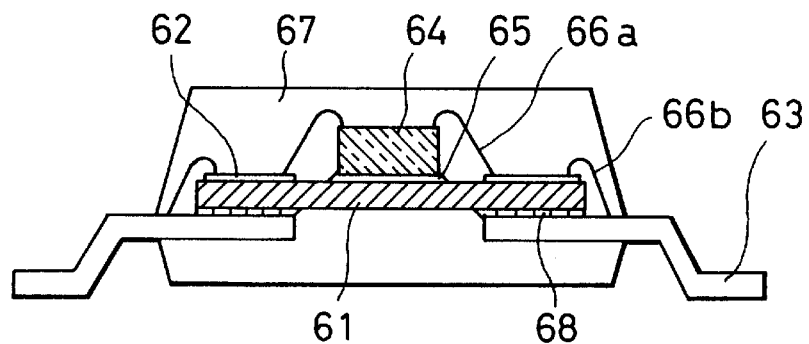
FIG. 5 is a cross-sectional view of a fifth conventional plastic-molded semiconductor device.
Figure 6:
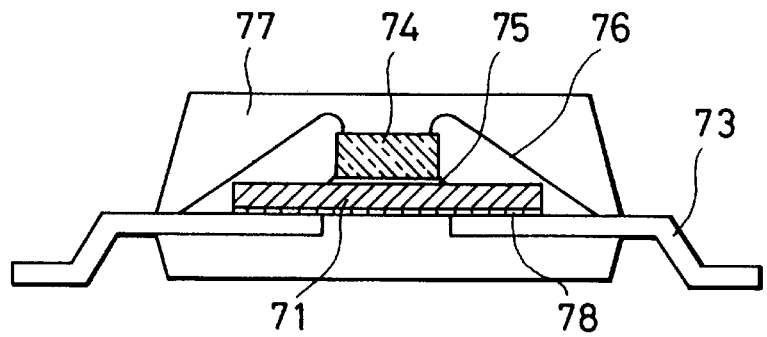
FIG. 6 is a cross-sectional view of a sixth conventional plastic-molded semiconductor device.
Figure 7:
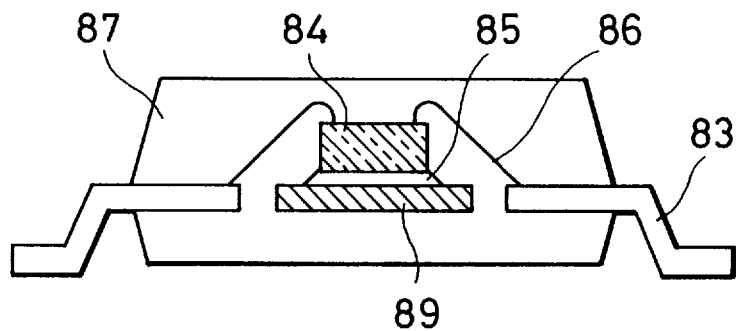
FIG. 7 is a cross-sectional view of a seventh conventional plastic-molded semiconductor device.
Figure 8:
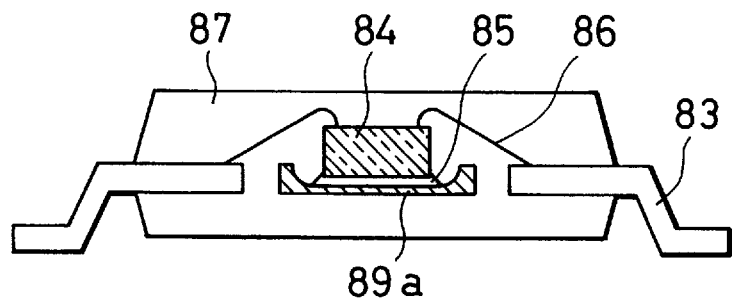
FIG. 8 is a cross-sectional view of an eighth conventional plastic-molded semiconductor device.
Figure 9:
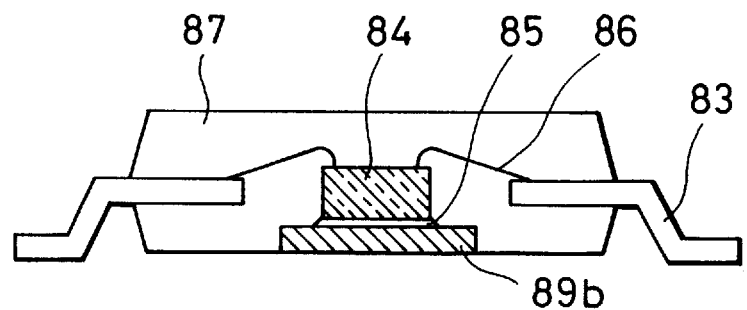
FIG. 9 is a cross-sectional view of a ninth conventional plastic-molded semiconductor device.
Figure 10:
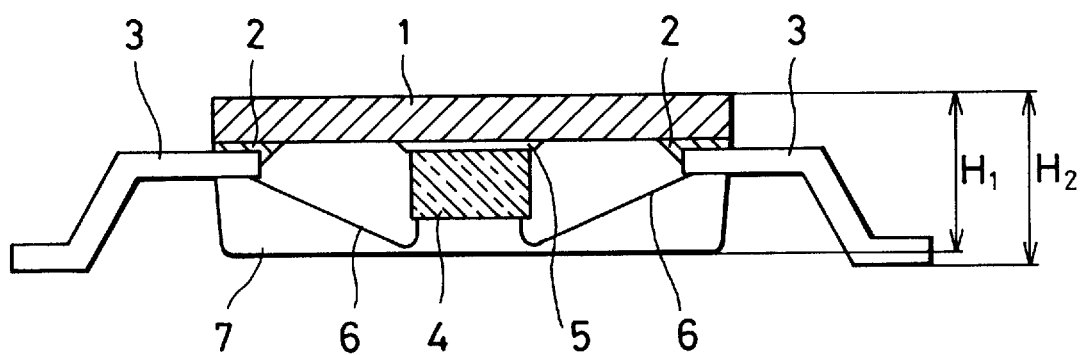
FIG. 10 is a cross-sectional view of a plastic-covered semiconductor device according to a first embodiment of the invention.

As shown in FIG. 10, a plastic-covered semiconductor device according to a first embodiment has a substrate 1 at the top of the device. The substrate 1 is made of a superiorly heat-resistant epoxy-system resin sheet containing a woven glass cloth of 0.3 mm in thickness, which is produced by RISHO KOGYO CO., LTD. and termed CS-3525. The substrate 1 is formed to be a 10 mm×10 mm square by a die-punching process.

An insulating, thermosetting adhesive material layer 2 having a thickness of about 50 microns is formed on the bottom surface of the substrate 1. The layer 2 is selectively formed at the periphery of the substrate 1 by a screen printing process. The adhesive material is produced by SUMITOMO BAKELITE CO., LTD. and termed CRP-3110A.

The inner parts or inner leads of lead fingers 3, which are made of a copper-alloy leadframe, are contacted with the adhesive material layer 2, so that the inner leads are bonded onto the bottom surface of the substrate 1 by the layer 2.

The inner parts of the lead fingers 3 are attached to the layer 2 with accuracy and are heated to cure the layer 2, resulting in the inner parts bonded onto the substrate 1.

The adhesive material termed CRP-3110A contains an epoxy-system resin, an amine-system curing agent, and a fine silica ($SiO_2$) powder as a filler. The silica powder is formed of spherical particles and is contained in the adhesive material at 55 wt %. Therefore, the material has a low glass transfer temperature of about 120° C. after curing. However, the material exhibits an extremely strong bonding strength even under heat because it contains no mold release agent such as that contained in the popular molding resin that is employed in the transfer molding process.

A lead pull test for the device showed an average pulling strength near 60 gf. This test also showed that the destruction occurred only at the lead fingers 3 and did not occur at the bonding parts of the fingers 3.

The surfaces of the lead fingers 3 are plated with nickel and gold by an electroplating process. The plated nickel layer (not shown in FIG. 10) has a typical thickness of 1.4 microns and the plated gold layer (not shown in FIG. 10) has a minimum thickness of 0.05 $\mu$m.

A semiconductor chip 4 is bonded to the bottom surface of the substrate 1 at its center by an epoxy-system, insulating, thermosetting adhesive material layer 5.

The adhesive material layer 5 is formed on the bottom surface of the substrate 1 at its center. The layer 5 is selectively formed in the central mounting area of the substrate 1 by a dispense process. The adhesive material is produced by SUMITOMO BAKELITE CO., LTD. and termed CRM-1120. The CRM-1120 adhesive material is obtained by changing the granularity distribution of the silica filler particles and the viscosity of the epoxy-system resin contained in the above adhesive material that is termed CRP-3110A and used for bonding the lead fingers 3 onto the substrate 1, resulting in low viscosity and low thixotropy. Thus, the CRM-1120 material can be supplied onto the substrate 1 by the dispense process. The property of the CRM-1120 material is similar to that of the CRP-3110A.

No conductive silver paste that has been popularly employed in a die-bonding process for the conventional plastic-molded packages is employed here, the reason of which is to avoid the electrical short-circuit of the inner parts of the lead fingers 3 due to the applied silver paste. Therefore, it is needless to say that the conductive silver paste may be employed if there is no possibility of short-circuit due to the sufficiently long distance from the ends of the inner parts of the lead fingers 3 to the semiconductor chip 4.

The inner parts of the lead fingers 3 are electrically connected with the bonding pad (not shown) of the semiconductor chip 4 by bonding wire pieces 6, respectively by a popular thermosonic wire bonding process. A fine gold wire of 25 microns in diameter is used for the bonding wire pieces 6. The wire bonding process is performed at a low temperature of 120° C. in consideration with the glass transfer temperatures of the substrate 1 and the insulating adhesive material layers 2 and 5. Practically, a superior bonding operating efficiency and a superior bonding strength were obtained through this bonding process.

Of course, the bonding conditions should be determined to make a loop height of the wire pieces 6 as low as possible in order to obtain a thinner package than the conventional ones. To realize such thinner package, in the first embodiment, the bonding parameters of the thermosonic wire bonder are optimized and, at the same time, a gold wire used enables to provide a low loop height and a high bonding strength; the gold wire employed is produced by SUMITOMO METAL MINING CO., LTD. and termed SGL2. Practically, the maximum loop height of the bonding wire pieces 6 from the bottom surface of the semiconductor chip 4 was limited to 180 microns or less.

A plastic covering material 7 is formed to cover the bottom surface of the substrate 1, confining the semiconductor chip 4, bonding wire pieces 6 and the inner parts of the lead fingers 3 within the material 7. As shown in FIG. 10, the edge of the material 7 is substantially in accordance with that of the substrate 1. The top surface and side faces of the substrate 1 are exposed from the material 7. Not only the covering material 7 but also the substrate 1 form the package of the semiconductor device.

The material 7 is formed by a screen printing process using a screen composed of a mesh having an extremely high discharge performance and a patterned emulsion film attached to the mesh. The emulsion film has a thickness of 350 microns. The mesh is provided by TOPRO CORPORATION and is termed AM209.

As the covering material 7, an epoxy-system resin that is especially adjusted for this printing process is employed. This resin contains a silica filler at about 60 wt % in order to enhance the mechanical strength and to reduce the coefficient of linear expansion for the cured resin. All the particles of the silica filler are spherical to restrain the viscosity from increasing. A fine powder of a silica filler the average grain size of which is 1 micron or less is added to the material 7 at about 5 wt %.

The material 7 contains an amine compound as a curing agent or catalyst to enable curing thereof at a comparatively low temperature of 100° to 120° C.

Since the material 7 includes a large amount of the silica filler whose particles are spherical in shape, and has the increased thixotropy, it has extremely high viscosity of about several thousands PS for the screen printing process, which seems to be unable for the screen-printing.

In the first embodiment, the screen printing process for the covering material 7 was practically performed under the following conditions:

The screen printing machine used in the first embodiment was equipped with the above screen having the AM209 mesh and a squeezee. The movement or running speed of the squeezee, i.e., the printing speed, was set as a very low value of about 10 mm/sec. The printing process was finished in superior accuracy and yield.

The covering resin 7 was then cured at a temperature of 120° C. for three hours. The subsequent process steps to the curing process are the same as those in the conventional, popular plastic molding process except that no dam-bar or tie-bar removing process and no plating process for the outer parts of the lead fingers 3 were required.

Here, the outer parts of the lead fingers 3 are bent toward the opposite side of the substrate 1, the reason of which is as follows: Although the surface of the covering material 7 is uneven, the top surface of the substrate 1 is substantially flat. As a result, not only the package handling by vacuum absorption but also the attachment of a heat radiator onto the top surface of the substrate 1 can be facilitated by using the flat top surface of the substrate 1.

In the first embodiment, an obtainable package height H1 of the semiconductor device was typically 0.7 mm and an obtainable mounting height H2 thereof was 1.1 mm at the maximum.

With the semiconductor device according to the first embodiment, the semiconductor chip 4 is mounted on the bottom surface of the substrate 1 and the top surface thereof is exposed from the covering material 7. An edge of the covering material 7 is substantially in accordance with an edge of the substrate 1, and the substrate 1 acts as a top of the package of the semiconductor device.

Therefore, a screen printing process can be employed for the step of forming the covering material 7 instead of the conventional transfer molding process. This means that the structure and fabrication of the semiconductor device can be simplified to reduce the assembly cost of the device.

Also, since the plastic covering material 7 is formed only at the bottom surface of the substrate 1, the thickness or height of the package can be readily reduced.

Further, since no transfer molding process is necessary for forming the plastic covering material, the above problems caused by the transfer molding process do not occur.

SECOND EMBODIMENT

Figure 11:
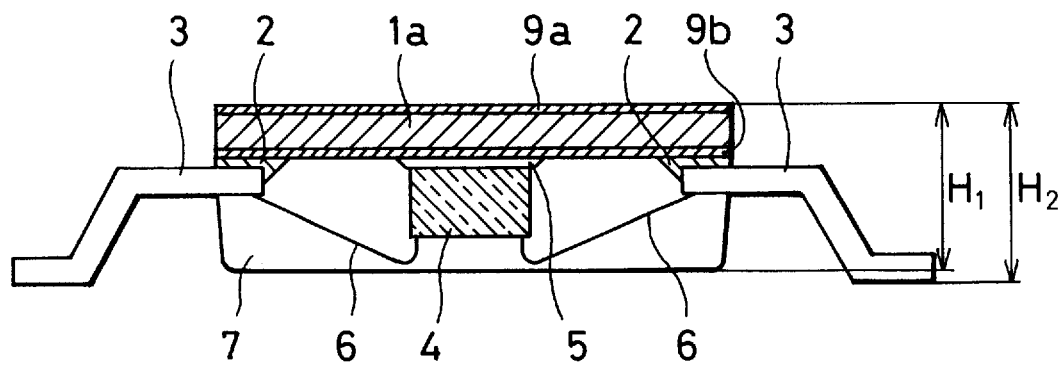
FIG. 11 is a cross-sectional view of a plastic-covered semiconductor device according to a second embodiment of the invention.

FIG. 11 shows a plastic-covered semiconductor device according to a second embodiment, which has the same structure as that of the first embodiment other than that a single-crystal silicon substrate 1a is provided and that silicon dioxide (SiO2) films 9a and 9b are formed on the top and bottom surfaces of the substrate 1a. The insulating adhesive material layers 2 and 5 are formed on the lower SiO2 film 9b.

The substrate 1a has a thickness of 0.6 mm. The SiO2 films 9a and 9b have each a thickness of 1 micron and are produced by a thermal oxidation process. The lower SiO-2 film 9b acts to ensure the electrical insulation of the lead fingers 3 from the substrate 1a. The upper SiO2 film 9a acts to protect the substrate 1a.

The substrate 1a is produced through a thermal oxidation process of a single-crystal silicon wafer having a thickness of 0.6 mm and a full-cut dicing process of the oxidized silicon wafer into the 10 mm×10 mm silicon pieces.

In the second embodiment, since the single-crystal silicon substrate 1a having a high thermal conductivity of three times that of polycrystalline alumina is employed, the semiconductor device has an extremely low thermal resistance. Also, since the silicon substrate 1a is the same in material as the silicon chip 4, no problem occurs due to the difference in the coefficient of linear expansion.

The reason for the substrate 1a whose thickness is 0.6 mm in the second embodiment is to make the surface area of the substrate 1a as wide as possible so that the heat generated in the semiconductor chip 4, is dissipated, resulting in further reduction in thermal resistance of the package.

In the second embodiment, an obtainable package height H1 of the semiconductor device was typically 1.0 mm and an obtainable mounting height H2 thereof was 1.4 mm at the maximum, because the substrate 1a is thicker than the substrate 1 of the first embodiment by 0.3 mm.

With the semiconductor device according to the second embodiment, the single-crystal silicon substrate 1a having the SiO2 films 9a and 9b at each side is employed instead of the glass/epoxy substrate 1 in the first embodiment, and the other structure is the same as that of the first embodiment. Therefore, the same advantages as those in the first embodiment can be obtained.

Further, additional advantages are that a higher thermal resistance can be obtained and that no problem is caused by the material difference between the semiconductor chip 4 and the substrate 1a. This leads to improved thermal reliability of the device.

TABLE 2

| ITEM | SINGLE CRYSTAL SILICON | POLY-CRYSTALLIN ALUMINA | GLASS EPOXY | COPPER ALLOY |
|---|---|---|---|---|
| THERMAL CONDUCTIVITY [cal/cm · sec · °C.] | 0.2 | 0.04~0.07 | 0.0007 | 0.7 |
| COEFFICIENT OF LINER EXPANSION [$10^{-8}$/°C.] | 3.5 | 7 | 15 | 17 |
| MODULUS OF ELASTICITY [$10^8$ kgf/cm$^2$] | 7~17 | 3 | 0.4 | 1 |

THIRD EMBODIMENT

Figure 12:
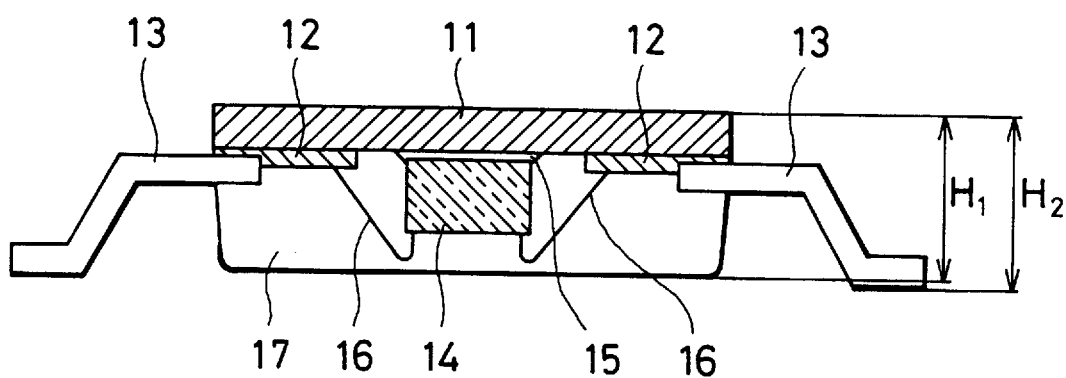
FIG. 12 is a cross-sectional view of a plastic-covered semiconductor device according to a third embodiment of the invention.

As shown in FIG. 12, a plastic-covered semiconductor device according to a third embodiment has a substrate 11 at the top of the device. The substrate 11 is made of an alumina (Al$_2$O$_3$) ceramic sheet having a thickness of 0.635 mm, which is produced by KYOCERA CORPORATION and termed A-476. The substrate 11 is formed to be a 28 mm×28 mm square by a full-cut die-punching process.

The alumina ceramic has a high rigidity sufficient for preventing the warp or bend of the package under the shrinkage stresses of a covering resin. This leads to a superior coplanarity of the outer pars or outer leads of the lead fingers 13. For the same reason, the substrate 11 is slightly thicker as 0.635 mm to enhance its rigidity.

The single-crystal silicon substrate 1a used in the second embodiment is very expensive, and therefore, it is difficult to employ the substrate 1a except for the packages requiring the especially low thermal resistance.

A patterned interconnection layer 12 that is made of a conductive copper paste and has a thickness of about 30 microns is formed on the bottom surface of the substrate 11. The layer 12 is selectively formed in the periphery of the substrate 11 by a screen printing process.

The conductive copper paste exhibits extremely high bonding strengths not only to the substrate 11 but also lead fingers 13.

The copper paste layer 12 is formed by a screen printing process using a screen that is provided by TOPRO COR- PORATION and is termed SX-300. The mesh is designed so that the minimum line width is 140/60 microns per space and a patterned emulsion film attached to the mesh. The emulsion film has a thickness of 20 microns.

The copper paste contains a thermosetting phenol-system resin and is especially adjusted for this printing process. This paste exhibits a superior screen-printing characteristic and superior bonding strengths not only to metals but also to the substrate 11. The copper paste exhibits a superior platability after curing.

Although the copper paste has a high viscosity of about 200 PS, it has a high thixotropy and provides less sagging even in the case of fine pattern printing.

The screen printing process for the copper paste was practically performed under the following conditions:

The screen printing machine used in the third embodiment was equipped with the above screen having the SX-300 mesh and a squeezee. The movement or running speed of the squeezee, i.e., the printing speed, was set as a very low value of about 50 mm/sec. To restrain an ooze of the paste from the printed pattern, the printing pressure and the clearance between the screen and the substrate 11 were reduced. The printing process was finished in superior accuracy and yield.

The inner parts or inner leads of lead fingers 13, made of a copper-alloy leadframe, are then contacted with the printed copper layer 12 with extreme accuracy and are heated to be cured, resulting in a mechanical connection of the layer 12 to the substrate 11 and electrical and mechanical connections of the inner parts of the fingers 13 to the layer 12. Thus, the inner leads of the fingers 13 are bonded onto the bottom surface of the substrate 11 through the layer 12.

The surfaces of the lead fingers 13 and that of the interconnection layer 12 are plated with nickel and gold by an electroplating process. The plated nickel layer (not shown in FIG. 12) has a typical thickness of 1.4 microns and the plated gold layer (not shown in FIG. 12) has a minimum thickness of 0.05 $\mu$m.

A semiconductor chip 14 is bonded to the bottom surface of the substrate 11 at its center by an epoxy-system, insulating, thermosetting adhesive material layer 15.

The adhesive material layer 15 is formed on the bottom surface of the substrate 11 at its center. The layer 15 is selectively formed in the central mounting area of the substrate 11 by a dispense process. The adhesive material is produced by SUMITOMO BAKELITE CO., LTD. and termed CRM-1120, and is the same as used in the first embodiment.

No conductive silver paste that has been popularly employed in a die-bonding process for the conventional plastic-molded packages is employed here, the reason of which is to avoid the electrical short-circuit of the inner parts of the lead fingers 13 due to the applied silver paste. Therefore, it is needless to say that the conductive silver paste may be employed if there is no possibility of short-circuit due to the sufficiently long distance from the ends of the inner parts of the lead fingers 13 to the semiconductor chip 14.

The inner ends of the patterned interconnection layer 12 are electrically connected with the bonding pads (not shown) of the semiconductor chip 14 by bonding wire pieces 16, respectively by a popular thermosonic wire bonding process. A fine gold wire of 25 microns in diameter is used for the bonding wire pieces 16.

The ends of the layer 12 is formed adjacent to the semiconductor chip 14, in other words, the inner ends of the lead fingers 13 are equivalently extended or prolonged to the vicinity of the chip 14, resulting in a shorter bonding distance. Therefore, the above fine gold wire can be employed.

Because the bonding wire pieces 16 are fine and the bonding distance is short, similarly to the first embodiment, the maximum loop height of the bonding wire pieces 16 from the bottom surface of the semiconductor chip 14 was practically limited to 120 microns or less under optimizing the bonding conditions and using the same gold wire as in the first embodiment.

The wire bonding process is performed at a low temperature of 120° C. in order to avoid mechanical stresses applied to the bonding part of the interconnection layer 12 and those of the inner parts of the lead fingers 13. Mechanical stresses to the bonding parts are caused by the thermal stress due to the coefficient difference of linear expansion. Practically, a superior bonding operating efficiency and a superior bonding strength were obtained through this bonding process.

A plastic covering material 17 is formed to cover the bottom surface of the substrate 11, confining the semiconductor chip 14, bonding wire pieces 16, patterned interconnection layer 2 and the inner parts of the lead fingers 13 within the material 17. As shown in FIG. 12, the edge of the material 17 is substantially in accordance with that of the substrate 11. The top surface and side faces of the substrate 11 are exposed from the material 17. Not only the covering material 17 but also the substrate 11 form the package of the semiconductor device.

Similarly to the first and second embodiments, the material 17 is formed by a screen printing process using a screen composed of a mesh having an extremely high discharge performance and a patterned emulsion film attached to the mesh. The emulsion film has a thickness of 300 microns. The mesh is provided by TOPRO CORPORATION and is termed AM209.

As the covering material 17, the same epoxy-system resin as used in the first embodiment is employed and the covering process is performed under the same conditions as those in the first embodiment. The printing process was finished with superior accuracy and yield.

The covering resin 17 was then cured at a temperature of 95° C. for about ten hours. The subsequent process steps to the curing process are the same as those in the conventional, popular plastic molding process except that no dam-bar or tie-bar removing process and no plating process for the outer parts of the lead fingers 13 were required.

To restrain the warp of the package, the covering temperature is lowered to 95° C. in the third embodiment. In this case, since the temperature difference between the curing temperature and room temperature is small, the shrinkage stress by the covering material 17 is reduced, enabling to restrain the warp. In response to the lower curing temperature, the curing time is set longer to about ten hours.

Also in the third embodiment, the outer parts of the lead fingers 13 are bent toward the opposite side of the substrate 11, the reason of which is the same as stated in the first embodiment.

In the third embodiment, an obtainable package height H1 of the semiconductor device was typically 1.035 mm and an obtainable mounting height H2 thereof was 1.435 mm at the maximum.

With the semiconductor device according to the third embodiment, the alumina ceramic substrate 11 is employed instead of the glass/epoxy substrate 1 of the first embodiment, and the semiconductor chip 14 is bonded to the substrate 11 though the screen-printed conductive copper paste layer 15 instead of the insulating adhesive material layer 5. The remaining structure is the same as that of the first embodiment. Therefore, the same advantages as those of the first embodiment can be obtained.

Further, since the conductive copper paste layer 15 is formed to be thinner than the insulating adhesive material layer 5 by the screen printing process, an additional advantage of a lower assembly cost and a lower package height than those of the first embodiment.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A plastic-covered semiconductor device comprising:

a substrate having a first surface and a second surface opposite to said first surface;

a semiconductor chip mounted on said first surface of said substrate by a first insulating adhesive material, said first insulating adhesive material being dispensable;

a patterned layer of a second insulating adhesive material formed on said first surface of said substrate and being of the type suitable for application by screen printing;

lead fingers joined to said first surface of said substrate by said second insulating adhesive material;

interconnecting conductors electrically interconnecting said semiconductor chip with said corresponding lead fingers, respectively;

a plastic covering material formed to cover said first surface of said substrate and being of the type suitable for application by screen printing;

each of said lead fingers being made of an inner part bonded to said first surface of said substrate and an outer part protruding said covering material;

said covering material confining said semiconductor chip, said interconnecting conductors and said inner parts of said lead fingers, an edge of said covering material being substantially in accordance with an edge of said first surface of said substrate;

said second surface of said substrate being exposed from said covering material; and said substrate acting as a top or bottom of a package of said semiconductor device.

2. The device as claimed in claim 1, wherein said substrate is made of a material selected from the group consisting of a synthetic resin, a single-crystal silicon and a ceramic.

3. The device as claimed in claim 1, wherein said outer parts of said lead fingers are bent to an opposite side to said second surface of said substrate.

4. The device as claimed in claim 1, wherein said interconnection conductors are bonded onto said corresponding inner parts of said finger leads, respectively.

5. A plastic-covered semiconductor device comprising:

a substrate having a first surface and a second surface opposite to said first surface;

a semiconductor chip mounted on said first surface of said substrate, said chip being insulated from said substrate;

lead fingers joined to said first surface of said substrate said lead fingers being insulated from said substrate;

interconnecting conductors electrically interconnecting said semiconductor chip with said corresponding lead fingers, respectively;

a plastic covering material formed to cover said first surface of said substrate;

each of said lead fingers being made of an inner part bonded to said first surface of said substrate and an outer part protruding said covering material;

said covering material confining said semiconductor chip, said interconnecting conductors and said inner parts of said lead fingers, an edge of said covering material being substantially in accordance with an edge of said first surface of said substrate;

said second surface of said substrate being exposed from said covering material;

said substrate acting as a top or bottom of a package of said semiconductor device; and a patterned conductive layer formed on said first surface of said substrate;

wherein said interconnection conductors and said corresponding inner parts of said lead fingers are connected with each other through said patterned conductive layer, respectively.

6. The device as claimed in claim 5, wherein said patterned conductor layer is formed by a screen printing process.

7. The device as claimed in claim 6, wherein said screen printing process is performed by using a conductive copper paste.

8. The device as claimed in claim 7, wherein said conductive copper paste contains a thermosetting phenol resin and a copper powder dispersed within said resin.

9. A plastic-covered semiconductor device comprising:

a substrate having a first surface and a second surface opposite to said first surface, said substrate being made of a synthetic resin;

a semiconductor chip bonded onto said first surface of said substrate by a first insulating adhesive material which is a dispensable material;

a patterned layer of a second insulating adhesive material formed on said first surface of said substrate and being of the type suitable for application by screen printing;

lead fingers bonded onto said first surface of said substrate by said second insulating adhesive material;

bonding wire pieces electrically interconnecting said semiconductor chip with said corresponding lead fingers, respectively;

a plastic covering material formed to cover said first surface of said substrate and being of the type suitable for application by screen printing;

each of said lead fingers being made of an inner part bonded onto said first surface of said substrate and an outer part protruding from said covering material;

said covering material confining said semiconductor chip, said bonding wire pieces and said inner parts of said lead fingers;

an edge of said covering material being substantially in accordance with an edge of said first surface of said substrate;

said second surface of said substrate being exposed from said covering material; and said substrate acting as a top or bottom of a package of said semiconductor device.

10. The device as claimed in claim 9, wherein said covering material is an epoxy resin containing silica filler whose particles are of a spherical shape and a curing catalyst.

11. The device as claimed in claim 9, wherein said outer parts of said lead fingers are bent to an opposite side to said second surface of said substrate.

12. A plastic-covered semiconductor device comprising:

a substrate having a first surface and a second surface opposite to said first surface, said substrate being made of a ceramic;

a patterned conductor layer formed on said first surface of said substrate;

a semiconductor chip mounted on said first surface of said substrate;

lead fingers joined to said patterned conductor layer;

bonding wire pieces electrically interconnecting said semiconductor chip with said corresponding lead fingers, respectively;

a plastic covering material formed to cover said first surface of said substrate;

each of said lead fingers being made of an inner part bonded onto said patterned conductor layer and an outer part protruding from said covering material;

said bonding wire pieces being bonded onto said patterned conductor layer;

said covering material confining said semiconductor chip, said bonding wire pieces, said patterned conductor layer and said inner parts of said lead fingers;

an edge of said covering material being substantially in accordance with an edge of said first surface of said substrate;

said second surface of said substrate being exposed from said covering material; and said substrate acting as a top or bottom of a package of said semiconductor device.

13. The device as claimed in claim 12, wherein said inner parts of said lead fingers are bonded onto said first surface of said substrate by using an insulating adhesive material;

and wherein said insulating adhesive material is applied on said first surface of said substrate by a screen printing process.

14. The device as claimed in claim 12, wherein said inner parts of said lead fingers are bonded onto said first surface of said substrate by using a first insulating adhesive material;

and wherein said first insulating adhesive material is applied on said first surface of said substrate by a screen printing process;

and wherein said semiconductor chip is bonded onto said first surface of said substrate by using a second insulating adhesive material;

and wherein said second insulating adhesive material is applied on said first surface of said substrate by a dispensing process.

15. The device as claimed in claim 12, wherein said patterned conductor layer is formed by a screen printing process.

16. The device as claimed in claim 15, wherein said screen printing process is performed by using a conductive copper paste.

17. The device as claimed in claim 16, wherein said conductive copper paste contains a thermosetting phenol resin and a copper powder dispersed within said resin.

18. The device as claimed in claim 12, wherein said patterned conductor layer and said inner parts of said lead fingers are mechanically and electrically connected with each other by contacting said inner parts of said lead fingers with said conductor layer and heating said inner parts of said lead fingers and said conductor layer.

19. The device as claimed in claim 12, wherein said plastic covering material is formed by a screen printing process.

20. In a plastic-covered semiconductor device comprising a substrate made of a material of a semiconductive material or an insulating material; a semiconductor chip mounted on a first surface of said substrate by a first insulating adhesive material which is a dispensable material; a patterned layer of a second insulating material formed on a second surface of the substrate and being of the type suitable for application by screen printing; lead fingers joined to said substrate; interconnecting conductors electrically interconnecting said semiconductor chip with said corresponding lead fingers, respectively; each of said lead fingers being made of an inner part and an outer part; a plastic covering material confining said semiconductor chip, said interconnecting conductors and said inner parts of said lead fingers; said inner parts of said lead fingers being bonded to said first surface of said substrate; and said outer parts of said lead fingers protruding from said covering material;

said plastic covering material being formed only at one surface of said substrate, and an opposite surface of said substrate being exposed from said covering material;

an edge of said covering material being substantially in accordance with an edge of said substrate, so that side faces of said covering material do not laterally protrude from said edge of said substrate; and said substrate acting as a top or bottom of a package of said semiconductor device.

21. The device as claimed in claim 20, wherein said plastic covering material is formed by a screen printing process.

22. The device as claimed in claim 20, wherein said outer parts of said lead fingers are bent toward an opposite side to said substrate.

* * * * *